United States Patent
Kim et al.

(10) Patent No.: US 9,224,946 B2
(45) Date of Patent: Dec. 29, 2015

(54) THREE-TERMINAL SYNAPSE DEVICE AND METHOD OF OPERATING THE SAME

(71) Applicants: Young-bae Kim, Seoul (KR); Hyun-sang Hwang, Pohang-si (KR)

(72) Inventors: Young-bae Kim, Seoul (KR); Hyun-sang Hwang, Pohang-si (KR)

(73) Assignees: SAMSUNG ELECTRONICS CO., LTD., Gyeonggi-Do (KR); POSTECH ACADEMY-INDUSTRY FOUNDATION, Gyeongsangbuk-Do (KR)

( * ) Notice: Subject to any disclaimer, the term of this patent is extended or adjusted under 35 U.S.C. 154(b) by 0 days.

(21) Appl. No.: 14/328,300

(22) Filed: Jul. 10, 2014

(65) Prior Publication Data
US 2015/0117090 A1 Apr. 30, 2015

(30) Foreign Application Priority Data
Oct. 25, 2013 (KR) ........................ 10-2013-0128019

(51) Int. Cl.
*H01L 29/02* (2006.01)
*H01L 45/00* (2006.01)
*G11C 13/00* (2006.01)
*H01L 27/24* (2006.01)

(52) U.S. Cl.
CPC ........ *H01L 45/1206* (2013.01); *G11C 13/0011* (2013.01); *G11C 13/0069* (2013.01); *H01L 27/249* (2013.01); *H01L 45/085* (2013.01); *H01L 45/1226* (2013.01); *H01L 45/145* (2013.01); *H01L 45/146* (2013.01); *H01L 45/147* (2013.01); *G11C 2013/0071* (2013.01); *G11C 2013/0083* (2013.01); *G11C 2213/32* (2013.01); *G11C 2213/52* (2013.01); *G11C 2213/53* (2013.01)

(58) Field of Classification Search
USPC ............ 257/2, 20, 24, 27, 124, 192, E29.229; 365/148
See application file for complete search history.

(56) References Cited

U.S. PATENT DOCUMENTS

2013/0103626 A1 4/2013 Hunzinger

FOREIGN PATENT DOCUMENTS

JP 06-037312 A 2/1994
KR 2013-0036318 A 4/2013

OTHER PUBLICATIONS

Kyungah Seo, "A Study on Synaptic Plasticity Characteristics in Resistive Switching Devices for Neuromorphic Device Applications", Department of Nanobio Materials & Electronics, Gwangju Institute of Science & Technology, 2011.
Y. Nishitani, "Three-terminal ferroelectric synapse device with concurrent learning function for artificial neural networks", Journal of Applied Physics 111, 2012, pp. 124108-1-124108-6.
Aono, et al., "The Atomic Switch", Proceedings of the IEEE, vol. 98, No. 12, Dec. 2010, pp. 2228-2236.

*Primary Examiner* — Timor Karimy
(74) *Attorney, Agent, or Firm* — Harness, Dickey & Pierce, P.L.C.

(57) ABSTRACT

A three-terminal synapse device may include a drain layer formed on a substrate, a gate layer formed on the drain layer, a source layer vertically stacked on the substrate and facing the drain layer and the gate layer. First and second vertical insulating layers may be formed between the source layer and a stack including the drain layer and the gate layer. The first and second vertical insulating layers have different ion mobilities from each other. The first and second vertical insulating layers may cover side surfaces of the drain layer and the gate layer. The ion mobility of the second vertical insulating layer may be greater than that of the first vertical insulating layer.

3 Claims, 5 Drawing Sheets

THREE-TERMINAL SYNAPSE DEVICE AND METHOD OF OPERATING THE SAME

CROSS-REFERENCE TO RELATED APPLICATION

This application claims priority under 35 U.S.C. §119 to Korean Patent Application No. 10-2013-0128019, filed on Oct. 25, 2013 in the Korean Intellectual Property Office, the disclosure of which is incorporated herein in its entirety by reference.

BACKGROUND

1. Field

The present disclosure relates to a resistive random access memory (RRAM)-based neuromorphic synapse device, and more particularly, to a three-terminal synapse device and/or a method of operating the same.

2. Description of the Related Art

A two-terminal resistive random access memory (RRAM) synapse device includes two identical electrodes for recording, erasing, and reading. As a result, it is relatively difficult to accurately control a change in resistance. Also, it is relatively difficult to obtain a spike-timing-dependent plasticity (STDP) characteristic.

SUMMARY

The present disclosure relates to a three-terminal synapse device that may increase a degree of integration and improve an operation control characteristic.

The present disclosure also relates to a method of operating the synapse device.

According to a non-limiting aspect of the present disclosure, a three-terminal synapse device may include a substrate, a horizontally-oriented stack on the substrate, and a vertically-oriented stack on a portion of the substrate adjacent to the horizontally-oriented stack. The horizontally-oriented stack may include a drain layer formed on the substrate and a gate layer formed on the drain layer. The vertically-oriented stack may include a first vertical insulating layer, a second vertical insulating layer, and a source layer. The source layer may be vertically stacked on the substrate and facing the drain layer and the gate layer. The first and second vertical insulating layers may be formed between the source layer and the horizontally-oriented stack including the drain layer and the gate layer. The first vertical insulating layer may have a first ion mobility and the second vertical insulating layer may have a second ion mobility that is different from the first ion mobility.

The first and second vertical insulating layers may cover side surfaces of the drain layer and the gate layer.

The second ion mobility of the second vertical insulating layer may be greater than the first ion mobility of the first vertical insulating layer.

According to another non-limiting aspect of the present disclosure, a method of operating a three-terminal synapse device may include generating a potential difference between the drain layer and the source layer to change a resistance of the first and second vertical insulating layers disposed therebetween. The three-terminal synapse device may be as described above. For instance, the three-terminal synapse device may include a drain layer, a source layer, and a gate layer as electrodes. The gate layer may be formed on the drain layer, the source layer may be disposed to face the drain layer and the gate layer, and the first and second vertical insulating layers may have different ion mobilities from each other. The first and second vertical insulating layers may be provided between the source layer and a horizontally-oriented stack including the drain layer and the gate layer.

The method may include forming an initial filament including a metal ion in the first and second vertical insulating layers. The method may further include changing a thickness of the initial filament by applying a voltage to the gate layer. The method may further include gradually thinning the initial filament by applying a negative voltage pulse to the gate layer one or more times.

The method may further include removing the initial filament in the first vertical insulating layer. The method may further include forming a subsequent filament in the first vertical insulating layer by applying a positive voltage pulse to the gate layer after the removing of the initial filament in the first vertical insulating layer.

The method may further include thickening the subsequent filament formed in the first vertical insulating layer by increasing a number of positive voltage pulses applied to the gate layer.

BRIEF DESCRIPTION OF THE DRAWINGS

The above and/or other aspects of the present disclosure will become apparent and more readily appreciated when the following description is taken in conjunction with the accompanying drawings in which.

DETAILED DESCRIPTION

Figure 1:
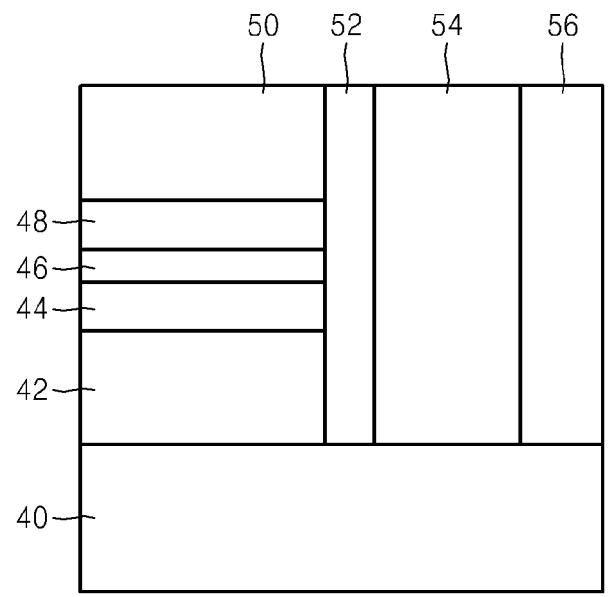
FIG. 1 is a cross-sectional view of a neuromorphic three-terminal resistive random access memory (RRAM) synapse device according to an example embodiment of the present disclosure.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a synapse device according to an example embodiment of the present disclosure.

Referring to FIG. 1, a lower insulating layer 42 is formed on a portion of a substrate 40. A drain layer 44, an interlayer insulating layer 46, a gate layer 48, and an upper insulating layer 50 are sequentially stacked on the lower insulating layer 42. The combination of the lower insulating layer 42, drain layer 44, interlayer insulating layer 46, gate layer 48, and upper insulating layer 50 may be regarded as a horizontally-oriented stack, because the constituent layers are horizontal layers. The drain layer 44 may be used as a drain electrode. The drain layer 44, which is a conductive layer, may be, for example, a copper (Cu) layer or a silver (Ag) layer. The interlayer insulating layer 46 may be, for example, an oxide layer. The gate layer 48 may be used as a gate electrode. The upper insulating layer 50 may be formed of the same insulating material as the lower insulating layer 42.

A first vertical insulating layer 52, a second vertical insulating layer 54, and a source layer 56 are sequentially stacked in a lateral direction on another portion of the substrate 40 that is adjacent the portion on which the horizontally-oriented stack is formed. The first vertical insulating layer 52, second vertical insulating layer 54, and source layer 56 may be regarded as a vertically-oriented stack, because the constituent layers are vertical layers. The vertically-oriented stack may be oriented perpendicularly to the horizontally-oriented stack.

The first vertical insulating layer 52 covers and contacts side surfaces of the lower insulating layer 42, the drain layer 44, the interlayer insulating layer 46, the gate layer 48, and the upper insulating layer 50. The first vertical insulating layer 52 may be an insulating layer having a predetermined or desired ion mobility. The first vertical insulating layer 52 may be formed, for example, of any one of $AlO_x$, $AlO_xN_y$, $SiN_x$, $SiO_xN_y$, and a high-dielectric insulating material. The high-dielectric insulating material may be an oxide or nitride. For example, the high-dielectric insulating material may be any one of $HfO_x$, $ZrO_x$, $TiO_x$, $LaO_x$, $SrO_x$, $HfSiO_x$, and $HfSiO_xN_y$. The second vertical insulating layer 54 may cover and contact a side surface of the first vertical insulating layer 52. The second vertical insulating layer 54 may be an insulating layer having a different ion mobility from the first vertical insulating layer 52. The ion mobility of the second vertical insulating layer 54 may be greater than that of the first vertical insulating layer 52. The second vertical insulating layer may be formed, for example, of any one of $AlO_x$, $AlO_xN_y$, $SiN_x$, $SiO_xN_y$, and a high dielectric insulating material. The source layer 56 covers and contacts a side surface of the second vertical insulating layer 54. The source layer 56 may be used as a source electrode. The source layer 56 is stacked in a direction perpendicular to the drain layer 44 and the gate layer 48. The source layer 56 is formed to face the drain layer 44 and the gate layer 48. As the gate layer 48 and the drain layer 44 are stacked in a direction perpendicular to an upper surface of the substrate 40, a degree of integration of the synapse device may increase compared to the case where a gate layer is arranged horizontally adjacent to a drain layer.

FIGS. 2 through 7 show operation processes of a synapse device according to an example embodiment of the present disclosure.

Figure 2:
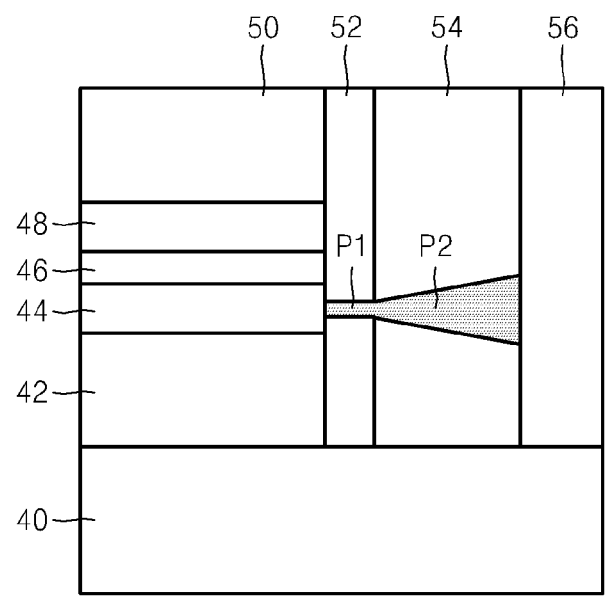
FIGS. 2 through 5 are cross-sectional views of operation processes of a synapse device when a negative voltage pulse is applied to a gate layer, according to an example embodiment of the present disclosure.

Referring to FIG. 2, a positive voltage is applied to the drain layer 44 to form a potential difference between the drain layer 44 and the source layer 56. The potential difference may be the same as or more than a voltage by which the first and second vertical insulating layers are turned on. Due to the potential difference, a first filament P1 and a second filament P2 are formed in the first vertical insulating layer 52 and the second vertical insulating layer 54, respectively, in a lateral direction. The first and second filaments P1 and P2 may include a metal atom of a positive ion (for example, a positive Cu ion or a positive Ag ion). Thus, the first and second filaments P1 and P2 may be a path through which currents flow. As the first and second filaments P1 and P2 are formed, a resistance of the first and second vertical insulating layers 52 and 54 decreases to a first resistance. While the potential difference is formed between the drain layer 44 and the source layer 56, the gate layer 48 remains in an off state in which no voltage is applied thereto.

Figure 3:
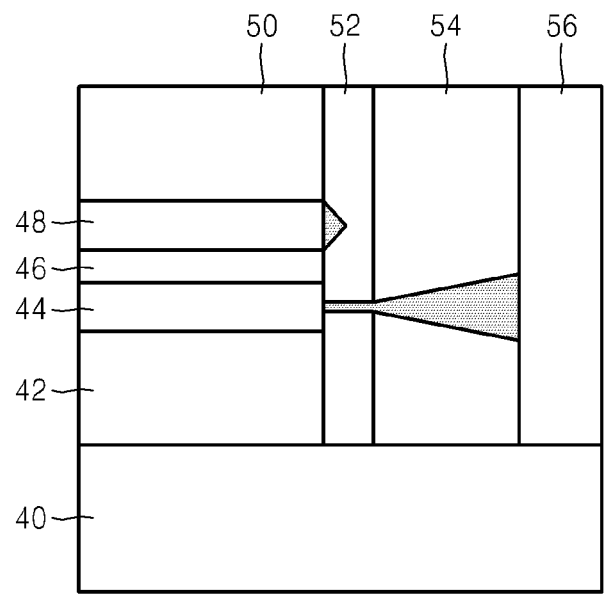

FIG. 3 shows a result when a negative voltage pulse is applied once to the gate layer for the state of FIG. 2.

Referring to FIG. 3, as the negative voltage pulse is applied once to the gate layer 48, the metal ion included in the first filament P1 adjacent to the gate layer 48 moves to the gate layer 48. That is, as the negative voltage pulse is applied once to the gate layer 48, a portion of the metal ion included in the first filament P1 moves to the gate layer 48. As a result, the thickness of the first filament P1 becomes less than that of the case of FIG. 2 when no voltage is applied to the gate layer 48. Accordingly, the resistance of the first and second vertical insulating layers 52 and 54 becomes a second resistance which is higher than the first resistance so that a resistance of the synapse device becomes higher than that of the case of FIG. 2.

Figure 4:
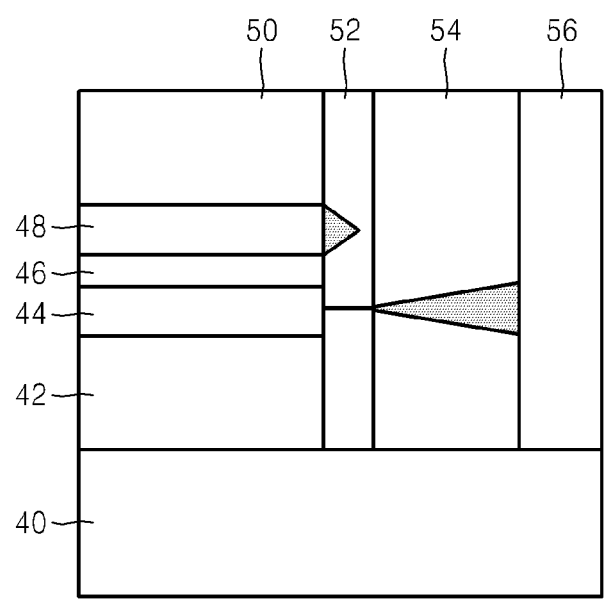

FIG. 4 shows a case where the thickness of the first filament P1 becomes less than that of the case of FIG. 3 when a negative voltage pulse of the same strength is applied twice to the gate layer 48 for the state of FIG. 2. Thus, in the case of FIG. 4, the resistance of the first and second vertical insulating layers 52 and 54 becomes a third resistance which is higher than the second resistance so that the resistance of the synapse device becomes higher than that of the case of FIG. 3.

Figure 5:
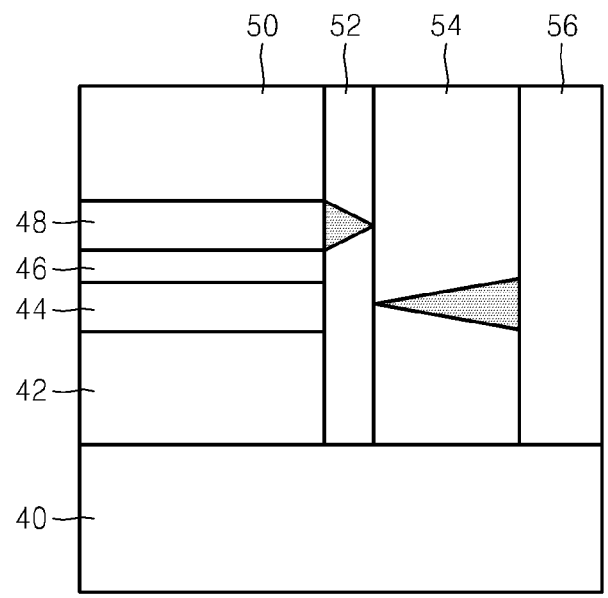

FIG. 5 shows a result when a negative voltage pulse of the same strength is applied three times to the gate layer 48 for the state of FIG. 2, or when the negative voltage pulse of the same strength is applied once more to the gate layer 48 for the state of FIG. 4.

Referring to FIG. 5, the first filament P1 disappears in the first vertical insulating layer 52. As a result, the resistance of the first and second vertical insulating layers 52 and 54 of FIG. 5 becomes a forth resistance which is higher than that of the case of FIG. 4 so that the resistance of the synapse device becomes higher than that of the case of FIG. 4.

As shown above, by controlling the negative voltage applied to the gate layer 48, the thickness of the first filament P1 may be continuously controlled. That is, the resistance of the first and second vertical insulating layers 52 and 54 may be continuously controlled by controlling the voltage applied to the gate layer 48, and, the resistance of the synapse device may be continuously controlled. Therefore, the synapse device according to an example embodiment of the present disclosure may be realized as an analog memory or a device appropriate for a spike-timing-dependent plasticity (STDP) characteristic. In addition, since the first and second vertical insulating layers 52 and 54 may be formed of multiple thin layers having different ion mobilities from one another, a recording/erasing speed may be improved. Moreover, since a reading mode is performed by applying a voltage lower than the potential difference between the drain layer 44 and the source layer 56 in a state in which the voltage applied to the gate layer 48 is fixed, the resistance of the first and second vertical insulating layers 52 and 54 may remain in the same state before and after the reading mode, which means an improvement of a data retention characteristic.

Furthermore, by using only the first filament P1, the resistance of the first and second vertical insulating layers 52 and 54 may be controlled accurately and uniformly, which means that an operation reliability and uniformity of the synapse device may be improved.

Figure 6:
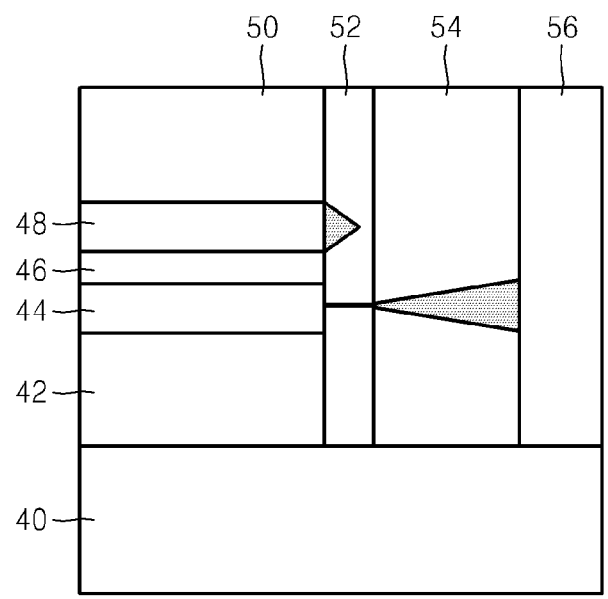
FIGS. 6 and 7 are cross-sectional views of operation processes of a synapse device when a positive voltage pulse is applied to a gate layer, according to another example embodiment of the present disclosure.
Figure 7:
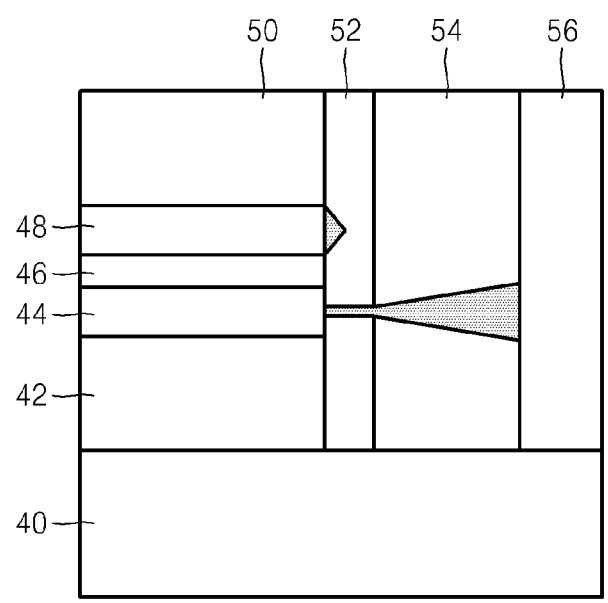

FIGS. 6 and 7 show states when a positive voltage pulse is applied once and twice to the gate layer 48 for the state of FIG. 5.

Referring to FIGS. 6 and 7, as the positive voltage pulse is applied to the gate layer 48, the first filament P1 reappears in the first vertical insulating layer 52, and as the number of times that the positive voltage pulse is applied increases, the thickness of the first filament P1 becomes greater. That is, resistance of the first and second vertical insulating layers 52 and 54 becomes lower so that the resistance of the three-terminal synapse device becomes lower.

Figure 8:
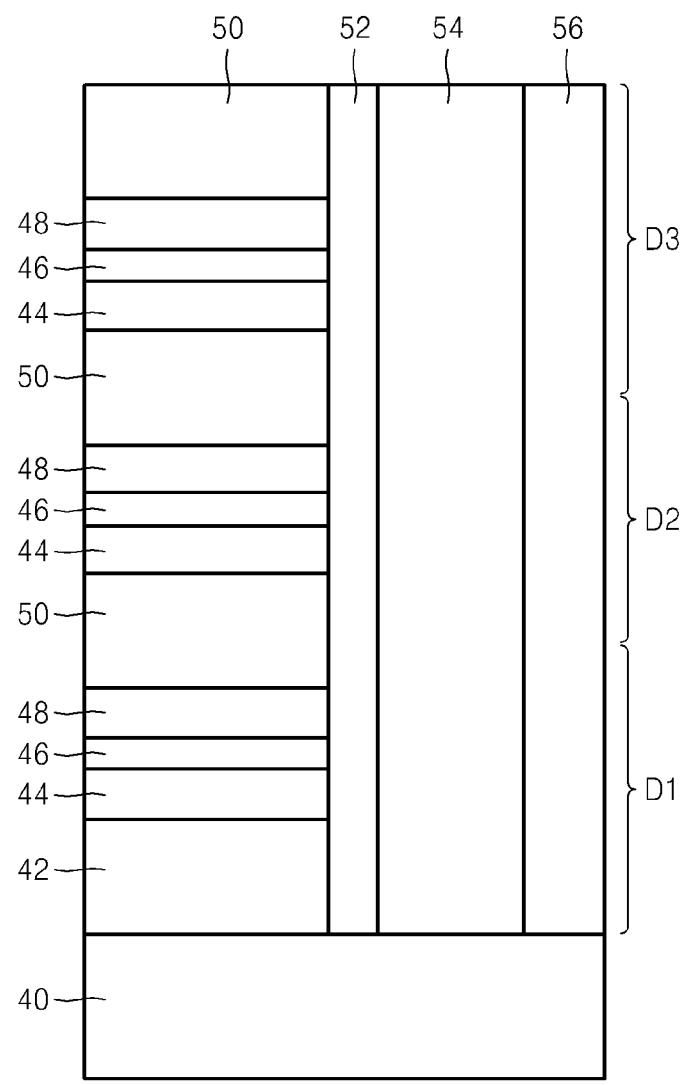
FIG. 8 is a cross-sectional view of a multi-layered synapse device according to an example embodiment of the present disclosure.

FIG. 8 shows a case where a synapse device is formed of multiple layers, according to an example embodiment of the present disclosure.

Referring to FIG. 8, first through third synapse devices D1 through D3 are sequentially formed on a substrate 40. The configuration of each of the first through third synapse devices D1 through D3 may be the same as described in FIG. 1. First and second vertical insulating layers 52 and 54 and a source layer 56 extend vertically to be used commonly by the first through third synapse devices D1 through D3. The operation of each of the first through third synapse devices D1 through D3 may be the same as described with reference to FIGS. 2 through 7.

As described above, according to the one or more of the above non-limiting embodiments of the present disclosure, the three-terminal synapse device has the gate layer and the drain layer vertically stacked. Thus, the degree of integration of the three-terminal synapse device and a degree of integration of an array including a plurality of three-terminal synapse devices may increase.

Also, since the thickness of the filament formed between the source and the drain may be precisely controlled by controlling the number of voltage pulses applied to the gate layer, the resistance state of the three-terminal synapse device may be precisely continuously controlled. Therefore, an operation reliability of the three-terminal synapse device may be relatively high and accurate control may be possible.

Furthermore, since the state of the filament may be maintained uniformly before and after the reading in the reading mode, the data retention characteristic of the three-terminal synapse device may be improved.

It should be understood that the example embodiments described therein should be considered in a descriptive sense only and not for purposes of limitation. Descriptions of configurations, features, and/or aspects within each embodiment should typically be considered as available for other similar configurations, features, and/or aspects in other embodiments.

While example embodiments of the present disclosure have been described herein with reference to the figures, it will be understood by those of ordinary skill in the art that various changes in form and details may be made without departing from the spirit and scope of the present disclosure as defined by the following claims.

What is claimed is:
1. A three-terminal synapse device comprising:
   a substrate;
   a horizontally-oriented stack on the substrate, the horizontally-oriented stack including a drain layer on the substrate and a gate layer on the drain layer;
   a vertically-oriented stack on a portion of the substrate adjacent to the horizontally-oriented stack, the vertically-oriented stack including a first vertical insulating layer, a second vertical insulating layer, and a source layer, the source layer facing the drain layer and the gate layer, the first and second vertical insulating layers between the source layer and the horizontally-oriented stack, the first vertical insulating layer having a first ion mobility and the second vertical insulating layer having a second ion mobility that is different from the first ion mobility.

2. The three-terminal synapse device of claim 1, wherein the first and second vertical insulating layers cover side surfaces of the drain layer and the gate layer.

3. The three terminal synapse device of claim 1, wherein the second ion mobility of the second vertical insulating layer is greater than the first ion mobility of the first vertical insulating layer.

\* \* \* \* \*